(12) United States Patent
Kulkarni et al.

(10) Patent No.: US 12,362,153 B2
(45) Date of Patent: Jul. 15, 2025

(54) PEDESTAL SETUP USING CAMERA WAFER

(71) Applicant: LAM RESEARCH CORPORATION, Fremont, CA (US)

(72) Inventors: Prasanna Kulkarni, Tigard, OR (US);
Rachel E. Batzer, Tigard, OR (US);
Ted Tan, West Linn, OR (US);
Vivekanandan Krishnaswamy, Bangalore (IN); Boonyarit Woonprasert, Tigard, OR (US); Shawn Fiedler, Tigard, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 654 days.

(21) Appl. No.: 17/630,218

(22) PCT Filed: Jul. 24, 2020

(86) PCT No.: PCT/US2020/043414
§ 371 (c)(1),
(2) Date: Jan. 26, 2022

(87) PCT Pub. No.: WO2021/021604
PCT Pub. Date: Feb. 4, 2021

(65) Prior Publication Data
US 2022/0282380 A1    Sep. 8, 2022

Related U.S. Application Data

(60) Provisional application No. 62/879,654, filed on Jul. 29, 2019.

(51) Int. Cl.
*H01L 21/67*   (2006.01)
*H01J 37/32*   (2006.01)
*H01L 21/68*   (2006.01)

(52) U.S. Cl.
CPC .. *H01J 37/32623* (2013.01); *H01J 37/32642* (2013.01); *H01J 37/32715* (2013.01); *H01L 21/681* (2013.01); *H01J 37/32633* (2013.01)

(58) Field of Classification Search
CPC .......... H01J 37/32642; H01J 37/32623; H01J 37/32633; H01J 37/32715; H01J 37/32091; H01J 37/321; H01L 21/681
See application file for complete search history.

(56) References Cited

U.S. PATENT DOCUMENTS 6,423,175 B1 *   7/2002   Huang ............... H01J 37/32642
                                              156/345.51
2004/0083975 A1 *   5/2004   Tong ................. H01J 37/32642
                                              118/728

(Continued)

FOREIGN PATENT DOCUMENTS

CN    101640181 A    2/2010
JP    H08330397 A    12/1996

(Continued)

OTHER PUBLICATIONS

International Search Report and Written Opinion of the ISA issued in PCT/US2020/043414, mailed Oct. 30, 2020; ISA/KR.

(Continued)

*Primary Examiner* — Luz L Alejandro Mulero

(57) ABSTRACT

A method comprises arranging an apparatus on a top surface of a pedestal in a processing chamber. The apparatus comprises an annular member, N supporting members, and N pins, where N is an integer greater than two. The N supporting members support the annular member in a plane parallel to and above the top surface of the pedestal. The N pins are arranged perpendicularly to the plane along a circumference around the annular member. Each of the N pins includes threads engageable with respective threaded slots in the apparatus. Each of the N pins includes a conical (Continued)

end pointing towards the top surface of the pedestal and engageable with a periphery of the top surface of the pedestal. The method further comprises aligning a center of the annular member to a center of the pedestal by adjusting one or more of the N pins.

10 Claims, 13 Drawing Sheets

(56) References Cited

U.S. PATENT DOCUMENTS

| | | | |
|---|---|---|---|
| 2004/0144488 A1 | 7/2004 | Shoya et al. | |
| 2007/0113783 A1* | 5/2007 | Lee | H01J 37/32642 156/345.31 |
| 2010/0243608 A1* | 9/2010 | Koshimizu | H01J 37/32577 134/1.1 |
| 2011/0005685 A1* | 1/2011 | Nguyen | H01J 37/321 156/345.43 |
| 2016/0211185 A1 | 7/2016 | Ravid et al. | |
| 2018/0053673 A1 | 2/2018 | Lee et al. | |

FOREIGN PATENT DOCUMENTS

| | | |
|---|---|---|
| JP | h09186226 A | 7/1997 |
| JP | 2009124081 A | 6/2009 |
| JP | 2011510498 A | 3/2011 |
| JP | 2017216442 A | 12/2017 |
| KR | 1020020083278 A | 11/2002 |
| KR | 1020030094736 A | 12/2003 |
| KR | 1020040076733 A | 9/2004 |
| KR | 1020070008254 A | 1/2007 |
| TW | 201743401 A | 12/2017 |
| TW | 201810382 A | 3/2018 |

OTHER PUBLICATIONS

Japanese Decision to Grant a Patent for Japanese Application No. 2022-506064 dated Apr. 23, 2024.
Chinese Office Action and Search Report for Chinese Application No. 202080055504.7 dated Jan. 8, 2024.
Taiwanese Office Action and Search Report for Taiwanese Application No. 109125390 dated Mar. 6, 2024.
Japanese Decision to Grant for Japanese Application No. 2024-86725 dated Mar. 25, 2025.

* cited by examiner

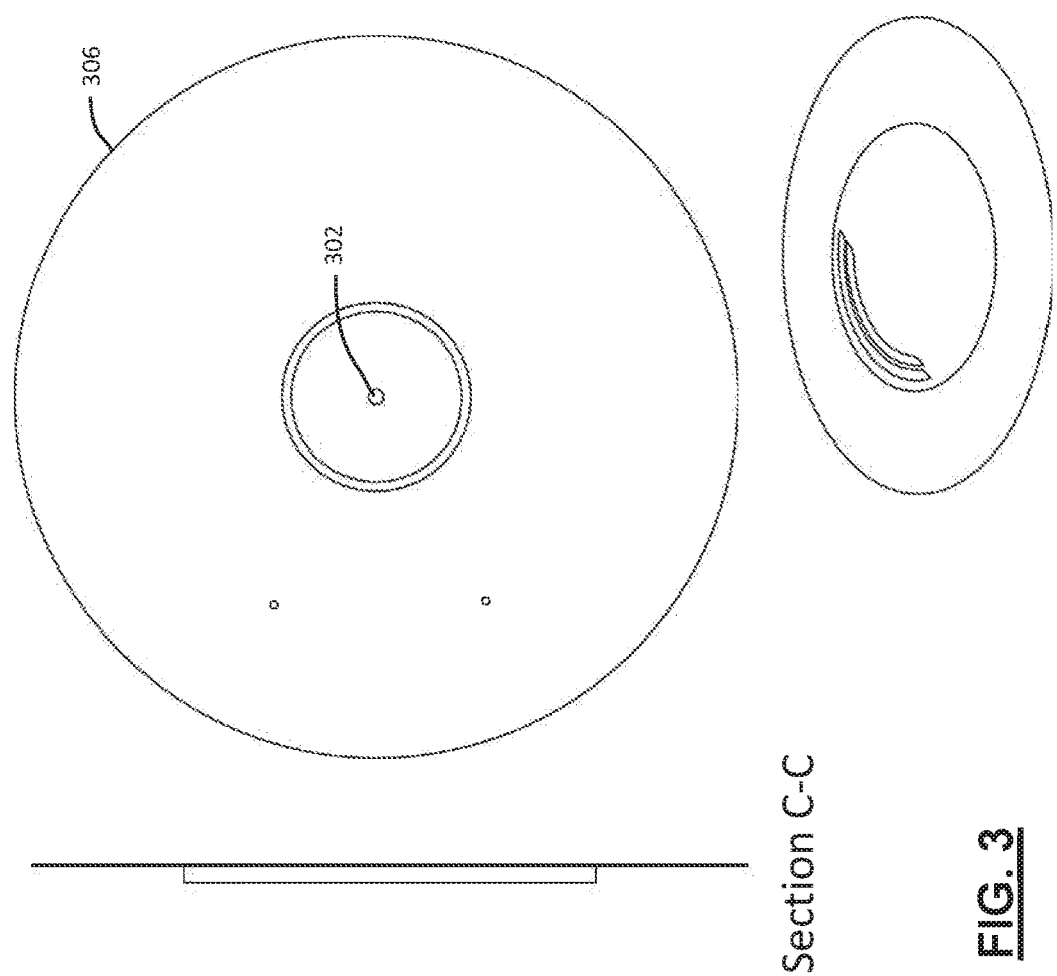
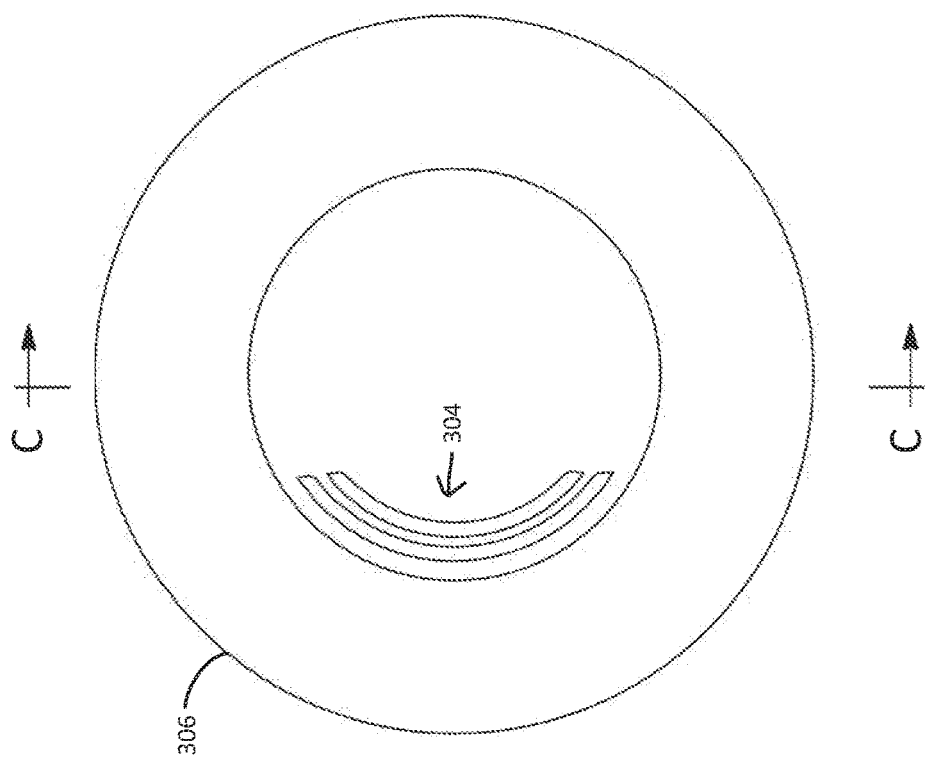
FIG. 3

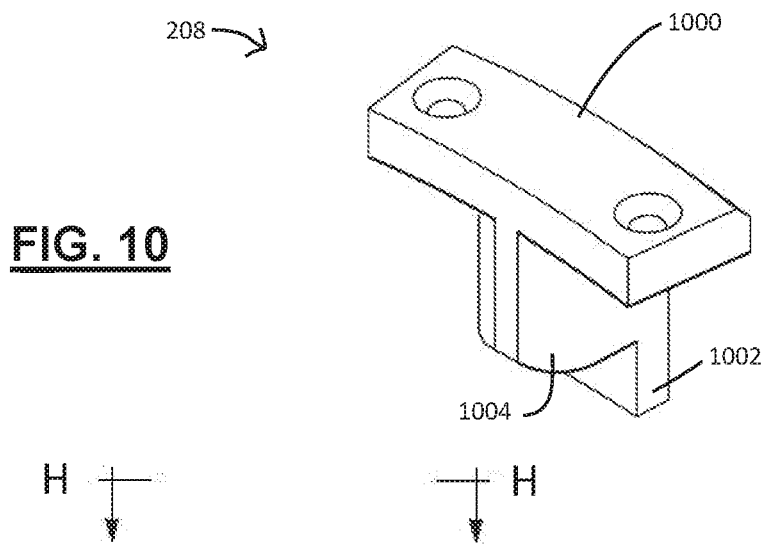
FIG. 10
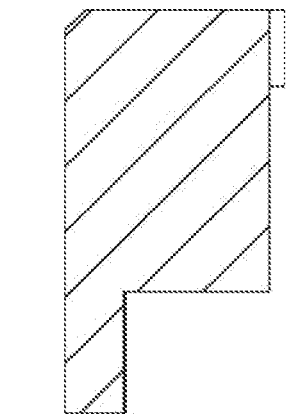
Section G-G
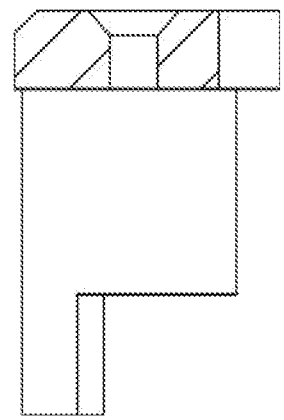
Section E-E
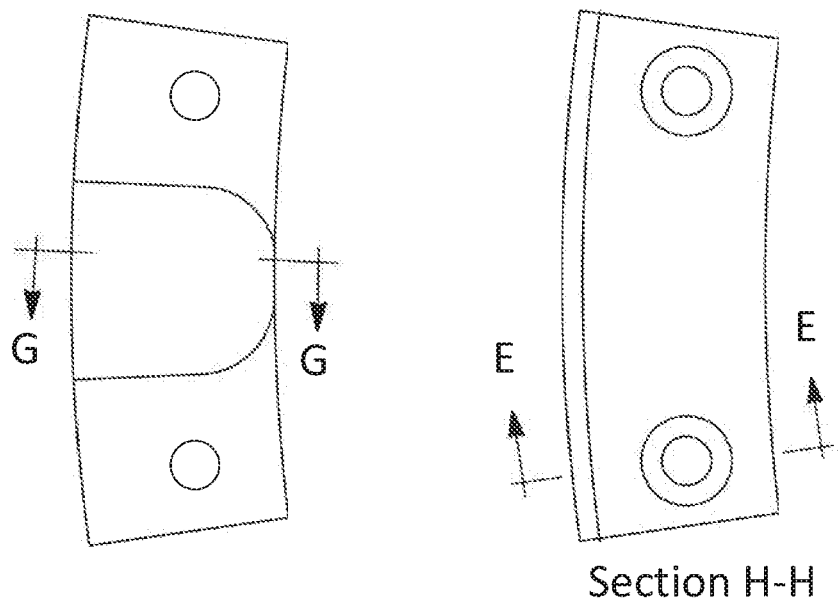
Section H-H FIG. 11
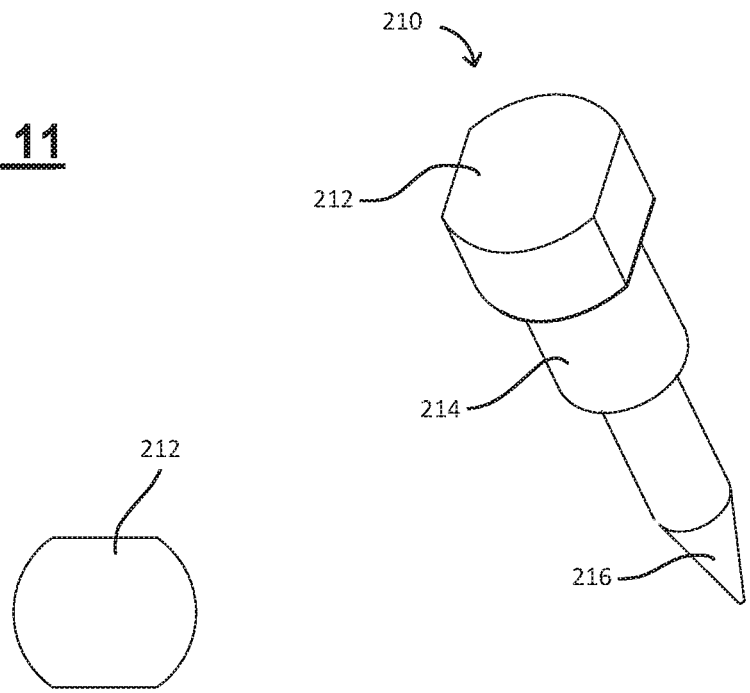
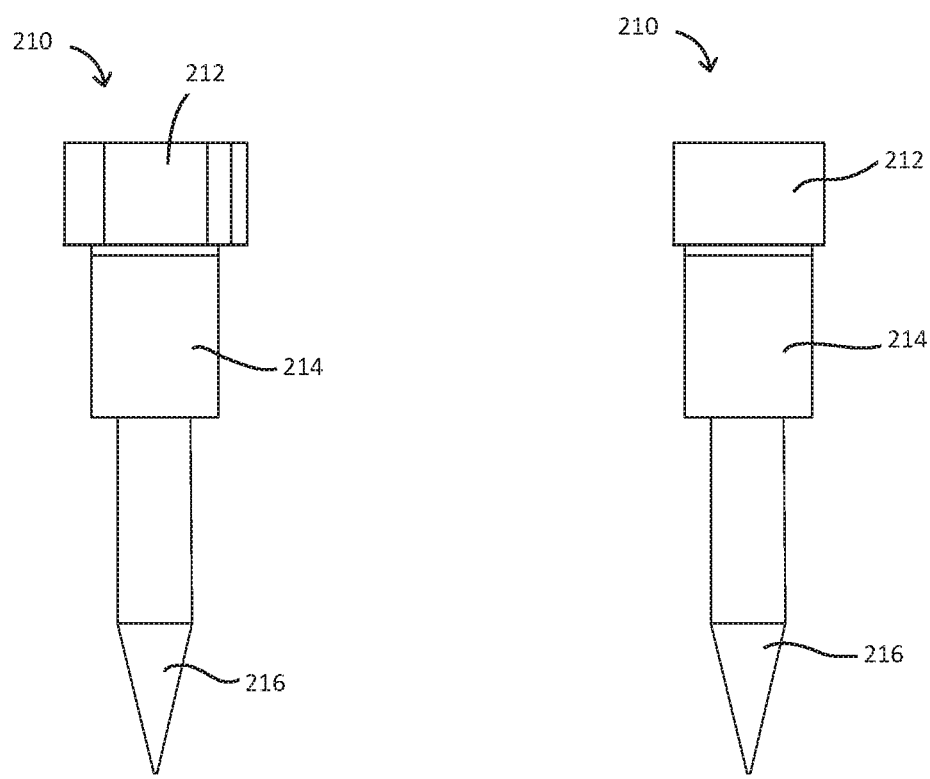

PEDESTAL SETUP USING CAMERA WAFER

CROSS-REFERENCE TO RELATED APPLICATIONS

The present disclosure is a U.S. National Phase Application under 35 U.S.C. 371 of International Application No. PCT/US2020/043414, filed on Jul. 24, 2020, which claims the benefit of U.S. Provisional Patent Application No. 62/879,654 filed on Jul. 29, 2019. The entire disclosures of the applications referenced above are incorporated herein by reference.

FIELD

The present disclosure relates generally to substrate processing systems and more particularly to a fixture for setting up pedestals using a camera wafer.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system typically includes a plurality of processing chambers (also called process modules) to perform deposition, etching, and other treatments of substrates such as semiconductor wafers. Examples of processes that may be performed on a substrate include, but are not limited to, a plasma enhanced chemical vapor deposition (PECVD) process, a chemically enhanced plasma vapor deposition (CEPVD) process, and a sputtering physical vapor deposition (PVD) process. Additional examples of processes that may be performed on a substrate include, but are not limited to, etching (e.g., chemical etching, plasma etching, reactive ion etching, etc.) and cleaning processes.

During processing, a substrate is arranged on a substrate support such as a pedestal, an electrostatic chuck (ESC), and so on in a processing chamber of the substrate processing system. During deposition, gas mixtures including one or more precursors are introduced into the processing chamber, and plasma is struck to activate chemical reactions. During etching, gas mixtures including etch gases are introduced into the processing chamber, and plasma is struck to activate chemical reactions. A computer-controlled robot typically transfers substrates from one processing chamber to another in a sequence in which the substrates are to be processed.

SUMMARY

An apparatus comprises an annular member arranged along a first plane and N first members extending from an outer diameter of the annular member perpendicularly to the first plane, where N is an integer greater than two. A first portion of each of the N first members extends above the first plane, and a second portion of each of the N first members extends below the first plane. The apparatus further comprises N second members extending radially outward from the second portions of the N first members along a second plane that is parallel to the first plane. Each of the N second members lies between a different pair of the N first members.

In another feature, the annular member, the N first members, and the N second members constitute a single structure.

In another feature, the annular member, the N first members, and the N second members are made of a metal.

In another feature, the apparatus further comprises N third members of equal lengths and made of a non-abrasive material respectively extending downward from the N second members perpendicularly to the second plane.

In another feature, the apparatus further comprises N pins having equal lengths and conical ends and made of a non-abrasive material respectively extending downward from the N second members perpendicularly to the second plane. The N pins are equidistant from a center of the annular member and include threads engageable with threaded slots in the N second members.

In other features, the apparatus further comprises N third members of equal lengths and made of a non-abrasive material arranged in respective slots in the N second members. Each of the N third members is arc-shaped and includes a first element, a second element, and a third element. The first element is fastened to a respective one of the N second members parallel to the second plane. The second element extends perpendicularly from the first element below the second plane and below the respective one of the N second members. The third element extends perpendicularly from the first element below the second plane and below the respective one of the N second members, and extends less than the second element.

In another feature, the first, second, and third elements constitute a single structure.

In another feature, the first element has a greater arc length than the second and third elements.

In another feature, distal ends of the third elements of the N third members lie in a plane parallel to the second plane.

In another feature, the apparatus further comprises N pins of equal lengths and made of the non-abrasive material extending downward perpendicularly to the second plane through respective threaded slots in the N second members at the same radial distance from a center of the annular member. Each of the N pins includes a top portion, a conical bottom portion, and a threaded portion between the top and bottom portions engageable with a respective one of the threaded slots.

In still other features, a method comprises arranging an apparatus on a top surface of a pedestal in a processing chamber. The apparatus comprises an annular member, N supporting members, and N pins, where N is an integer greater than two.

The N supporting members support the annular member in a plane parallel to and above the top surface of the pedestal. The N pins are arranged perpendicularly to the plane along a circumference around the annular member. Each of the N pins includes threads engageable with respective threaded slots in the apparatus. Each of the N pins includes a conical end pointing towards the top surface of the pedestal and engageable with a periphery of the top surface of the pedestal. The method further comprises aligning a center of the annular member to a center of the pedestal by adjusting one or more of the N pins.

In other features, the method further comprises arranging N level indicating devices in respective slots in the apparatus in contact with respective ones of the N pins. The method further comprises aligning the center of the annular member to the center of the pedestal by adjusting one or more of the N pins until the N level indicating devices indicate the same level.

In other features, the method further comprises arranging a wafer concentrically on the annular member. The wafer includes a camera at a center of the wafer. The camera points toward a showerhead arranged above the pedestal in the processing chamber. The method further comprises capturing one or more images of the showerhead using the camera. The method further comprises aligning the center of the pedestal to a center of the showerhead based on the one or more images.

In other features, the method further comprises arranging a wafer concentrically on the annular member. The wafer includes a camera at a center of the wafer. The camera points toward a showerhead arranged above the pedestal in the processing chamber. The wafer further includes a wireless transmitter to communicate with the camera and with a computing device external to the processing chamber. The method further comprises transmitting the one or more images using the wireless transmitter to the computing device, processing the one or more images at the computing device, and aligning the center of the pedestal to a center of the showerhead based on the processing.

In other features, the method further comprises arranging a wafer concentrically on the annular member. The wafer includes a camera at a center of the wafer. The camera points toward a showerhead arranged above the pedestal in the processing chamber. The wafer further includes a wireless transmitter to communicate with the camera and a computing device external to the processing chamber. The method further comprises closing the processing chamber and creating vacuum in the processing chamber. The method further comprises capturing one or more images of the showerhead using the camera and transmitting the one or more images using the wireless transmitter to the computing device. The method further comprises processing the one or more images at the computing device and moving the pedestal based on the processing until the center of the pedestal is aligned to a center of the showerhead.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3 shows a wafer comprising a camera that is used with the fixture to align the pedestal to the showerhead in the processing chamber;

FIG. 10 shows structural details of contact pads of the fixture that rest on the pedestal;

FIG. 11 shows structural details of pins on the fixture that are used to align the fixture to the pedestal;

In the drawings, reference numbers may be reused to identify similar and/or identical elements.

DETAILED DESCRIPTION

Figure 1:
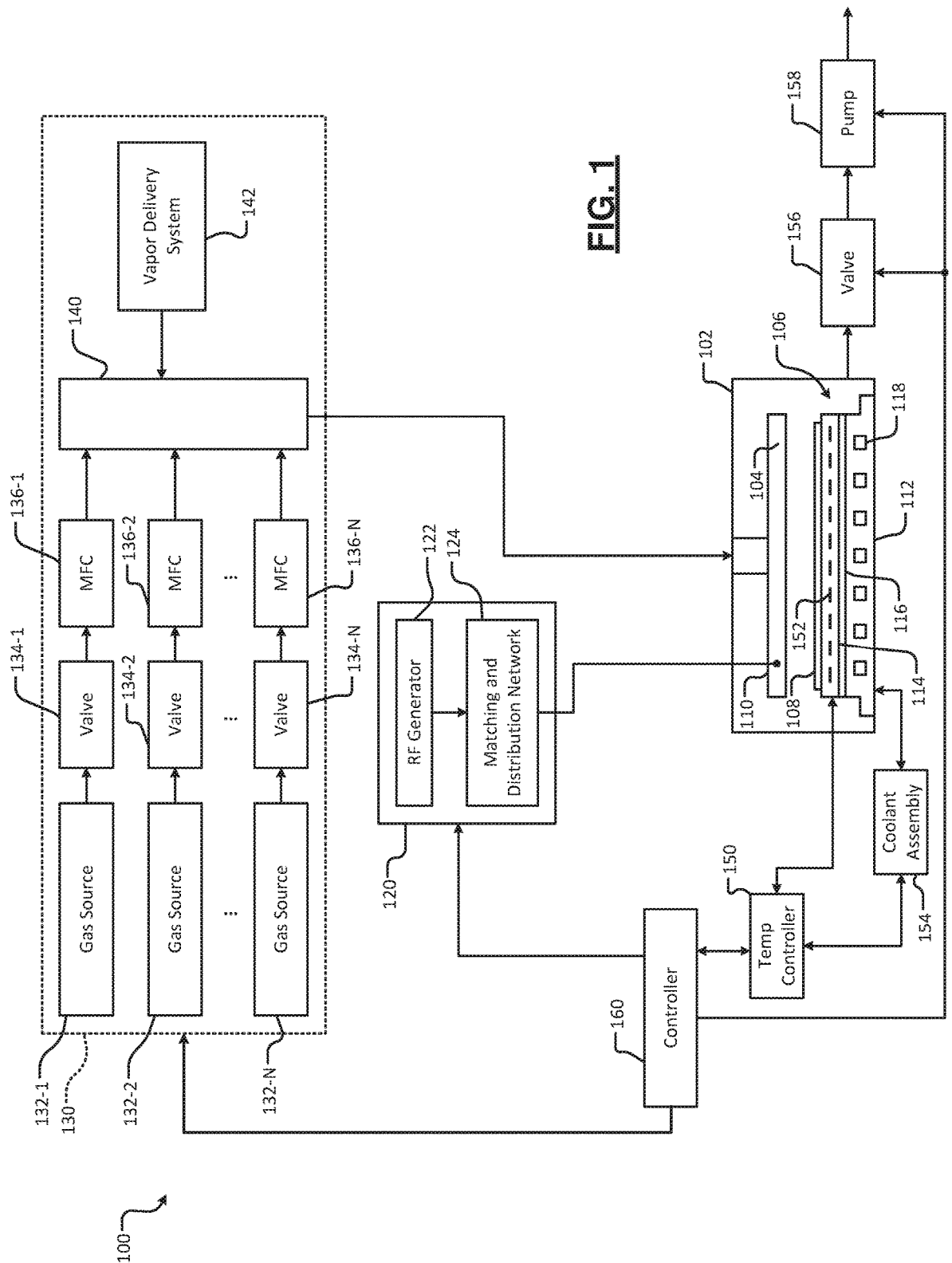
FIG. 1 shows an example of a substrate processing system comprising a processing chamber.

On-wafer uniformity (e.g., in deposition processes) depends on pedestal to showerhead alignment. A gap between the pedestal and showerhead bore impacts flow of process gases. A non-uniform gap causes non-uniform flow, which in turn increases non-uniformity. Pedestals are typically setup with reference to the center of the processing chamber, which leads to the non-uniform gap.

A wafer with an integrated camera at the center of the wafer (hereinafter the camera wafer) is used to align the pedestal and the showerhead. However, when the camera wafer is used for alignment between the camera wafer and the pedestal, it is difficult to achieve repeatable results. Current fixtures used with the camera wafer either fit loosely on the pedestal, which adversely impacts repeatability of the setup, or scratch the pedestal by being too tight. To achieve close pedestal-showerhead alignment, the camera wafer needs to be well centered on the pedestal. The fixture used with the camera wafer needs to provide repeatability to the alignment process. The fixture also needs to accommodate various pedestal sizes and variations (tolerances).

A fixture designed according to the present disclosure places the camera wafer on a pedestal without scratching the pedestal and provides repeatability of up to 0.005". The fixture improves the repeatability of the pedestal-showerhead alignment process. The fixture accommodates various sizes of pedestals regardless of whether the pedestals are bare, coated, or conditioned, and regardless of the material used to construct the pedestals (e.g., metal, ceramic, etc.).

Current methods of setting up pedestals align the pedestals to the spindle. A fixture used for this purpose has large tolerances and does not necessarily align the pedestal to the showerhead. The misalignment leads to azimuthal non-uniformity. With increasing demand for on-wafer uniformity, the non-reliable pedestal alignment process might lead to multiple openings of the processing chamber to recover the processing chamber after pedestal installation or replacement.

Using the systems and methods of the present disclosure, the camera wafer is used to setup each pedestal in alignment with its showerhead while accurately compensating for large system level tolerances. The fixture designed according to the present disclosure is dimensioned closely to an outer diameter (OD) of the camera wafer. That is, the fixture uses the OD of the camera wafer that is manufactured to tight tolerance to center the camera wafer on the fixture.

The fixture with the camera wafer rests on the top surface of the pedestal. The camera wafer rests on a raised annular platform of the fixture that is parallel to the top surface of the pedestal. Due to the design features of the fixture explained below in detail, the raised annular platform of the fixture provides a venting path for trapped air, good connectivity between the camera wafer and data acquisition device used for alignment, and easy access to the camera wafer for placement and removal of the camera wafer. The fixture has three legs (called contact pads in the description below) that are made of non-abrasive surface to prevent damage to pedestal surface. The tolerances of height and parallelism of the legs are tightly controlled.

The fixture is centered on the pedestal using three conical pins that reference an OD of the pedestal. The conical pins are made of non-abrasive material to protect the pedestal surface. The conical pins are threaded into the fixture and can be adjusted to accommodate pedestals of varying ODs. The length of the conical pins is tightly controlled. When the conical pins are adjusted to align the centers of the fixture and the pedestal, the cone shaped ends of the conical pins slide vertically (up and down) along the OD of the pedestal. This moves the fixture horizontally parallel to the top surface of the pedestal, which facilitates alignment of the centers of the fixture and the pedestal.

To align the centers of the fixture and the pedestal, the height of a conical pin's top surface relative to a reference surface of the fixture is measured using dial gauges (level indicators). When all three conical pins are set to same height, the end points of the conical pins define a circle that is concentric to the fixture and the camera wafer. At this point, the centers of the fixture and the camera wafer are aligned to the center of the pedestal. Then the center of the pedestal is aligned to the center of the showerhead (i.e., the center of the camera wafer and the center of the fixture is aligned to a hole at the center of the showerhead) by moving the pedestal as explained below in detail.

The fixture can also be used to deliberately create calculated offsets between the centers of the fixture and the pedestal by varying pin heights. This feature can be used to create intentional offsets between the pedestal and the showerhead to compensate for other azimuthal non-uniformity. The fixture has markings with which a notch on the camera wafer is aligned for repeatability of the alignment procedure.

Accordingly, the fixture according to present disclosure provides accurate, repeatable, and pedestal specific alignment. The fixture accommodates various pedestal sizes. The fixture has non-abrasive contacts. The fixture performs pedestal alignment at process height since the raised annular platform of the fixture is used for the alignment process.

The present disclosure is organized as follows. Initially, an example of a processing chamber is shown and described with reference to FIG. 1. Subsequently, the structure of the fixture according to the present disclosure is explained with reference to FIGS. 2-11. Thereafter, the use of the fixture to align the pedestal to the showerhead is explained with reference to FIGS. 12 and 13. Specifically, the structural details of the fixture are shown and described with reference to FIGS. 2-7. Technical drawings of the fixture are shown in FIGS. 8-11. Then the alignment process using the fixture is explained with reference to FIGS. 12 and 13. Specifically, a system comprising the fixture and a computing device used to align the pedestal to the showerhead is shown and described with reference to FIG. 12. A method of aligning the pedestal to the showerhead using the fixture is shown and described with reference to FIG. 13.

FIG. 1 shows an example of a substrate processing system 100 comprising a processing chamber 102. While the example is described in the context of plasma enhanced chemical vapor deposition (PECVD), the teachings of the present disclosure can be applied to other types of substrate processing such as atomic layer deposition (ALD), plasma enhanced ALD (PEALD), CVD, or also other processing including etching processes. The system 100 comprises the processing chamber 102 that encloses other components of the system 100 and contains an RF plasma (if used). The processing chamber 102 comprises an upper electrode 104 and an electrostatic chuck (ESC) 106 or other substrate support. During operation, a substrate 108 is arranged on the ESC 106.

For example, the upper electrode 104 may include a gas distribution device 110 such as a showerhead that introduces and distributes process gases. The gas distribution device 110 may include a stem portion including one end connected to a top surface of the processing chamber 102. A base portion of the showerhead is generally cylindrical and extends radially outwardly from an opposite end of the stem portion at a location that is spaced from the top surface of the processing chamber 102. A substrate-facing surface or faceplate of the base portion of the showerhead includes a plurality of holes through which vaporized precursor, process gas, or purge gas flows. Alternately, the upper electrode 104 may include a conducting plate, and the process gases may be introduced in another manner.

The ESC 106 comprises a baseplate 112 that acts as a lower electrode. The baseplate 112 supports a heating plate 114, which may correspond to a ceramic multi-zone heating plate. A thermal resistance layer 116 may be arranged between the heating plate 114 and the baseplate 112. The baseplate 112 may include one or more channels 118 for flowing coolant through the baseplate 112.

If plasma is used, an RF generating system 120 generates and outputs an RF voltage to one of the upper electrode 104 and the lower electrode (e.g., the baseplate 112 of the ESC 106). The other one of the upper electrode 104 and the baseplate 112 may be DC grounded, AC grounded, or floating. For example only, the RF generating system 120 may include an RF generator 122 that generates RF power that is fed by a matching and distribution network 124 to the upper electrode 104 or the baseplate 112. In other examples, the plasma may be generated inductively or remotely.

A gas delivery system 130 includes one or more gas sources 132-1, 132-2, . . . , and 132-N (collectively gas sources 132), where N is an integer greater than zero. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. A vapor delivery system 142 supplies vaporized precursor to the manifold 140 or another manifold (not shown) that is connected to the processing chamber 102. An output of the manifold 140 is fed to the processing chamber 102.

A temperature controller 150 may be connected to a plurality of thermal control elements (TCEs) 152 arranged in the heating plate 114. The temperature controller 150 may be used to control the plurality of TCEs 152 to control a temperature of the ESC 106 and the substrate 108. The temperature controller 150 may communicate with a coolant assembly 154 to control coolant flow through the channels 118. For example, the coolant assembly 154 may include a coolant pump, a reservoir, and one or more temperature sensors (not shown). The temperature controller 150 operates the coolant assembly 154 to selectively flow the coolant through the channels 118 to cool the ESC 106. A valve 156 and pump 158 may be used to evacuate reactants from the processing chamber 102. A system controller 160 controls the components of the system 100.

Figure 2:
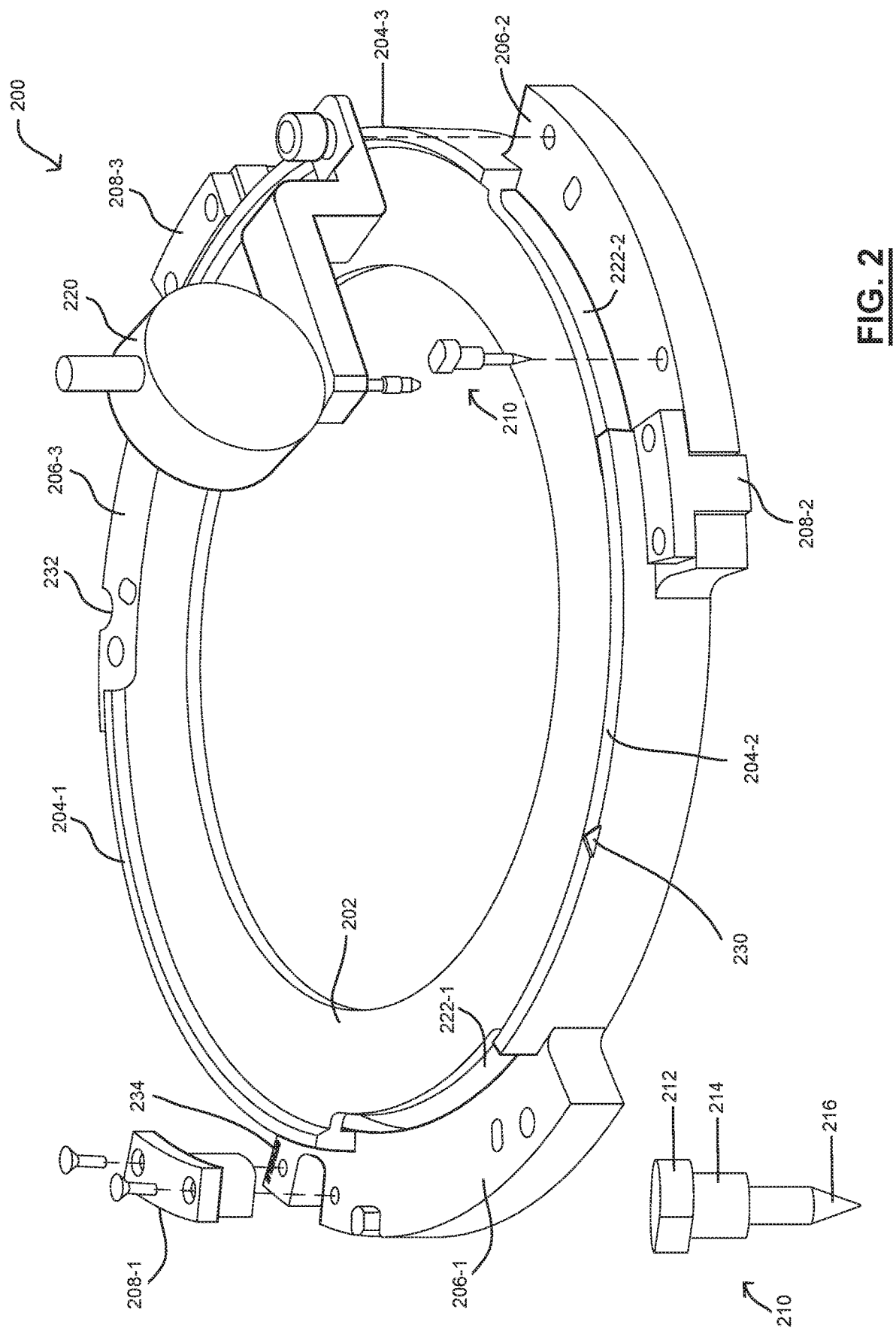
FIG. 2 shows a fixture for aligning a pedestal to a showerhead in the processing chamber.

FIG. 2 shows a fixture 200 for aligning the pedestal to the showerhead according to the present disclosure. The fixture 200 comprises an annular platform 202 on which a camera wafer (shown in FIG. 3) rests. The annular platform 202 may also be called an annular element, portion, or member of the fixture 200. The annular platform 202 is parallel to a plane of the camera wafer. An outer diameter (OD) of the annular platform 202 closely matches an OD of the camera wafer. The fixture 200 is manufactured so that the OD of the annular platform 202 conforms to the OD of the camera wafer. Therefore, when the camera wafer is placed on the annular platform 202, the centers of the camera wafer and the annular platform 202 are automatically aligned.

The OD of the annular platform 202 (and therefore the OD of the camera wafer) is constrained by a plurality of arc-shaped vertical elements of the fixture 200. For example, three vertical elements are shown at 204-1, 204-2, and 204-3 (collectively, vertical elements 204). The vertical elements 204 may also be called vertical portions or members of the fixture 200. Each vertical element 204 extends circumferentially around the OD of the annular platform 202. The vertical elements 204 are perpendicular to the plane of the annular platform 202 (and therefore to the plane of the camera wafer). The vertical elements 204 are integrated with and extend from the annular platform 202. That is, the vertical elements 204 and the annular platform 202 are manufactured as a single piece and are inseparable from each other.

A first (top) portion of each vertical element 204 extends vertically above the annular platform 202 and constrains the camera wafer. A second (bottom) portion of each vertical element 204 extends vertically below the annular platform 202 and does not contact the top surface of the pedestal. Rather, the bottom portions of the vertical elements 204 and the annular platform 202 are raised above the top surface of the pedestal by a set of contact pads (described below) when the fixture 200 is placed on the top surface of the pedestal.

The vertical elements 204 are not connected to each other to form a cylindrical shape surrounding the annular platform 202. Rather, in the example shown with three vertical elements 204, an arc length of each vertical element 204 is less than a third of the OD of the annular platform 202. That is, the sum of the arc lengths of the vertical elements 204 is less than the OD of the annular platform 202. The centers of the arc lengths of the vertical elements 204 lie at vertices of an equilateral triangle. The centers of the arc lengths of the vertical elements 204, and the vertices of the equilateral triangle lie on a circle that is concentric with the center of the annular platform 202 (i.e., with the center of the fixture 200). While three vertical elements are shown, N vertical elements may be used instead, where N is an integer greater than two.

Figure 5:
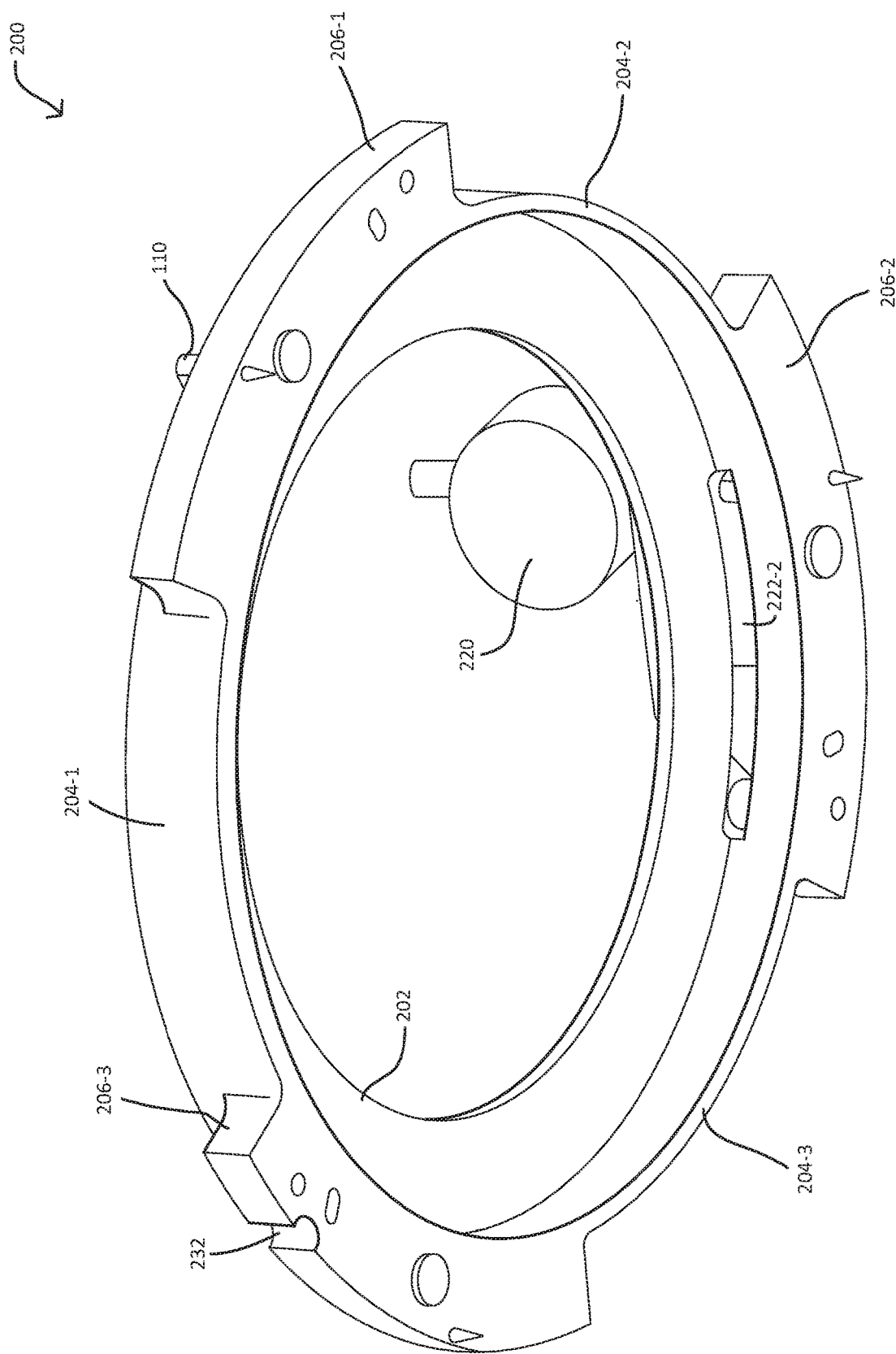
FIG. 5 shows a view of the fixture from an underside of the fixture.
Figure 8:
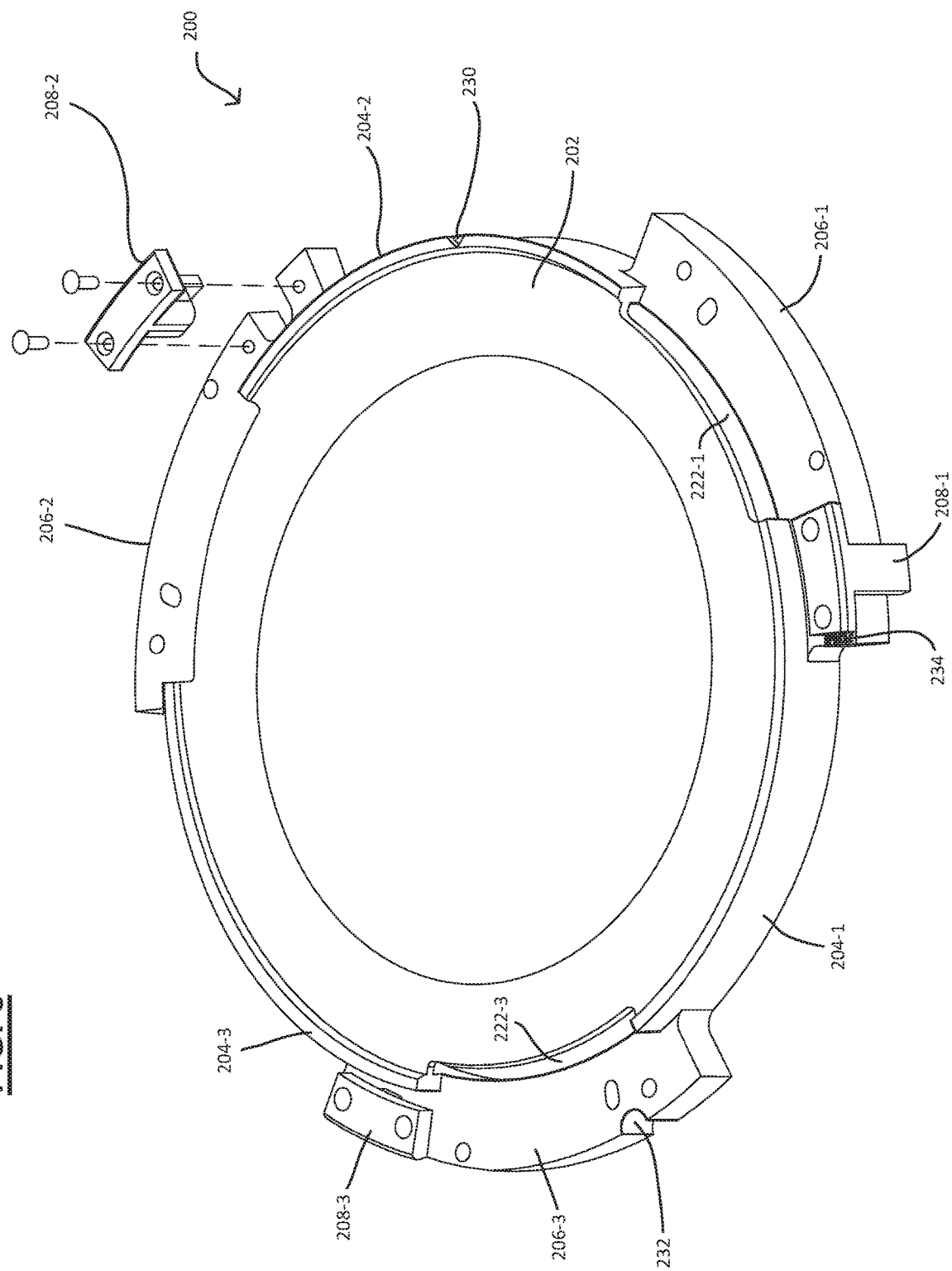
FIGS. 8 and 9 show additional structural details of the fixture.

The fixture 200 further comprises a plurality of arc-shaped horizontal elements 206-1, 206-2, and 206-3 (collectively, horizontal elements 206, all three can be seen in FIGS. 5 and 8) that extend radially outwardly from the OD of the annular platform 202. The horizontal elements 206 may also be called horizontal portions or members of the fixture 200. The horizontal elements 206 are perpendicular to the vertical elements 204. The horizontal elements 206 lie in a plane parallel to the plane of the annular platform 202 (and therefore to the plane of the camera wafer).

The plane in which the horizontal elements 206 lie is below the plane in which the annular platform 202 lies (and is therefore below the plane of the camera wafer). The plane in which the horizontal elements 206 lie is closer to the top surface of the pedestal than the plane in which the annular platform 202 lies. The plane in which the horizontal elements 206 lie is also called a reference plane in the description below. The bottom portions of the horizontal elements 206 and the bottom portions of the vertical elements 204 lie on the same plane.

Similar to the vertical elements 204, the horizontal elements 206 are not connected to each other to form an annular shape surrounding the annular platform 202. Rather, the ends of each horizontal element 206 are connected to two vertical elements 204. Specifically, each horizontal element 206 is connected to a different pair of the vertical elements 204. For example, first and second ends of the horizontal element 206-1 are respectively connected to first ends of the vertical elements 204-1 and 204-2; first and second ends of the horizontal element 206-2 are respectively connected to the second end of the vertical element 204-2 and the first end of the vertical element 204-3; and first and second ends of the horizontal element 206-3 are respectively connected to the second ends of the vertical elements 204-3 and 204-1.

The centers of the arc lengths of the horizontal elements 206 also lie at vertices of an equilateral triangle. The centers of the arc lengths of the horizontal elements 206 and the vertices of the equilateral triangle lie on a circle that is concentric with the center of the annular platform 202 (i.e., the center of the fixture 200). The number of the horizontal elements 206 is the same as the number of the vertical elements 204. The horizontal elements 206 are also integrated with and extend from the vertical elements 204. That is, the horizontal elements 206, the vertical elements 204, and the annular platform 202 are manufactured as a single piece, which is the fixture 200, and are inseparable from each other.

Each of the horizontal elements 206 includes a contact pad (shown as 208-1, 208-2, and 208-3; collectively contact pads 208) that rests on the pedestal. The contact pads 208 are also arc-shaped similar to the horizontal elements 206 and are inserted into slots in the horizontal elements 206. The contact pads 208 are shown and described in further detail with reference to FIG. 10. The contact pads 208 may also be called supporting structures, members, or elements of the fixture 200. For example only, the contact pads 208 may be located at or near the first ends of the horizontal elements 206. Accordingly, the contact pads 208 lie at vertices of an equilateral triangle and on a circle that is concentric with the center of the annular platform 202 (i.e., the center of the fixture 200).

Each of the horizontal elements 206 includes a pin 210 used for alignment. The pins 210 are inserted into threaded slots in the horizontal elements 206. Each pin 210 includes a top measurement surface (or a head portion) 212, threads 214, and a conical (or a bottom) portion 216 for adjustment as described below in detail. The pin 210 is shown in further detail in FIG. 11. The threads 214 engage with the threaded slots in the horizontal elements 206 and are small enough (e.g., 100 threads per inch) for fine adjustment during alignment.

The conical portion 216 is designed to engage with and slide vertically along an OD (i.e., periphery, perimeter, or circumference) of the top surface of the pedestal as the pin 210 is rotated. That is, the conical portion 216 is designed to slide perpendicularly to the plane of the annular platform 202 and the plane of the camera wafer. The conical portion 216 is designed to accommodate and adjust for pedestals with varying ODs as explained below with reference to FIG. 12.

For example, the pins 210 may be located adjacent to the contact pads 208 on the horizontal elements 206. The pins 210 lie at vertices of an equilateral triangle. Further, the locations of the pins 210 are tightly controlled relative to the center of the fixture 200, which is also the center of the camera wafer due to the tight tolerances with which the fixture 200 is manufactured. Specifically, the locations of the pins 210 lie on a circle that is concentric with the center of the fixture 200 (i.e., the center of the annular platform 202), which helps the alignment procedure as explained below in detail.

Each of the horizontal elements 206 includes a receptacle for mounting a level measurement device (or a level indicator) 220. Each level indicator 220 measures or indicates a level of the corresponding horizontal element 206 relative to the plane of the annular platform 202 (and therefore relative to the plane of the camera wafer). For example only, the level indicators 220 may be located at or near the second ends of the horizontal elements 206. The level indicators 220 read a base level (zero) on the reference plane, which is the plane in which the horizontal elements 206 lie. The level indicators 220 measure the height of the pins 210. When the height on all three pins 210 is equal, the conical ends points of the pins 210 define (i.e., lie on) a concentric circle with reference to the center of the fixture 200, which is also the center of the camera wafer and the center of the annular platform 202.

The locations of the contact pads 208, the pins 210, and the level indicators 220 as shown are for example only. The locations can be other than those shown so long as symmetry of the locations as described above is maintained. For example, the positions of the contact pads 208 and the level indicators 220 on each horizontal element 206 may be switched (i.e., interchanged). Alternatively, the level indicators 220 may be located between the contact pads 208 and the pins 210 on the respective horizontal elements 206. Alternatively, the contact pads 208 may be located between the level indicators 220 and the pins 210 on the respective horizontal elements 206.

Note that the number of the contact pads 208, the pins 210, and the level indicators 220 is the same as the number of the horizontal elements 206. Throughout the present disclosure the quantity of three for the vertical and horizontal elements 204 and 206 and for the contact pads 208, the pins 210, and the level indicators 220 is used for example only. The number of each of these items can be any number greater than or equal to three. For example, if four of each of these items are used, the symmetrical arrangements of these items may be expressed in terms of a square instead of an equilateral triangle, where the vertices of the square lie on a circle concentric with the center of the fixture 200.

Further, while the arc length of the vertical elements 204 is shown as greater than that of the horizontal elements 206, the arc length of the vertical elements 204 can be less than that of the horizontal elements 206. Alternatively, the arc length of the vertical elements 204 can be equal to that of the horizontal elements 206.

Since the annular platform 202 is raised by the second (bottom) portions of the vertical elements 204 and since the plane in which the horizontal elements 206 lie is below the plane of the annular platform 202, cutouts (i.e., gaps, openings, passages, or windows) exist between the annular platform 202 and the horizontal elements 206. The cutouts are shown at 222-1, 222-2, and 222-3 (collectively, cutouts 222, all three cutouts 222 can be seen in FIG. 5). The number of the cutouts 222 is the same as the number of the horizontal elements 206 and the vertical elements 204. The cutouts 222 provide a venting path for trapped air, good connectivity between the camera wafer and data acquisition device used for alignment, and easy access to the camera wafer for placement and removal of the camera wafer.

The fixture 200 is made of a metal as a single piece comprising the annular platform 202 and the vertical and horizontal elements 204 and 206. The fixture 200 can also be made of a non-metallic material. The contact pads 208 of the fixture 200 are made of a non-metallic material and non-abrasive such as polyoxymethylene or poly ether ketone (PEEK). The contact pads 208 are fastened (e.g., bolted) and sealed into the fixture 200 to avoid dimensional shift. The pins 210 are made of a non-metallic and non-abrasive material such as polyoxymethylene or polyetherimide. The pins 210 are locked using setscrews. These non-metallic and non-abrasive materials prevent scratching of the pedestal when the contact pads 208 and/or the pins 210 contact the top surface of the pedestal.

The fixture 200 includes a marking 230 to which a notch on the camera wafer is aligned. However, the camera wafer can be aligned with any other reference point on the fixture 200. The fixture 200 includes a marking 232 to align the fixture 200 with a pedestal hole. The fixture 200 includes a marking 234 to align the fixture 200 with spindle orientation.

Figure 12:
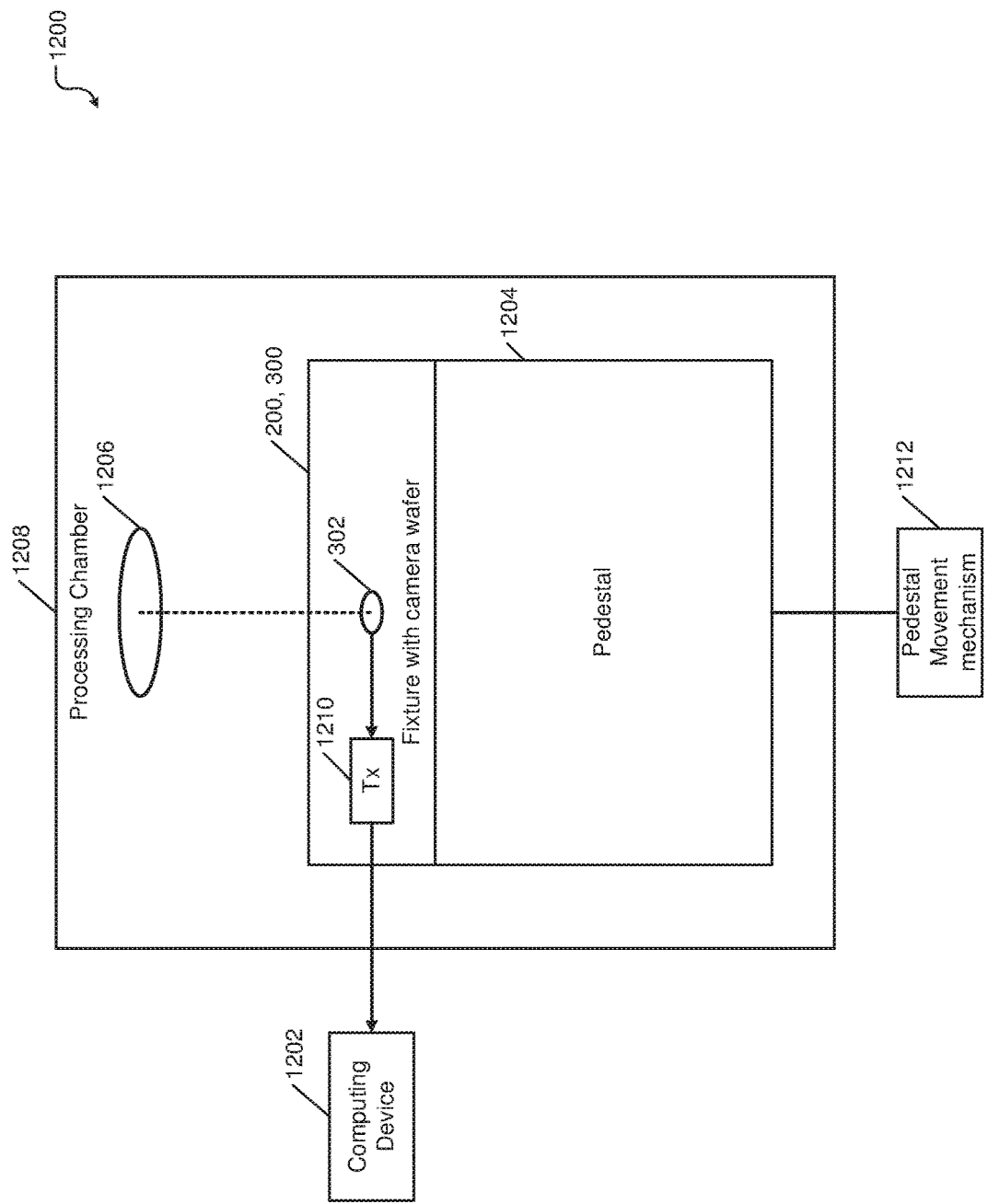
FIG. 12 shows a schematic of a system comprising the fixture and a computing device used to align the pedestal to the showerhead.

FIG. 3 shows a camera wafer 300. On a first (top) side, which faces the showerhead, the camera wafer 300 includes a camera 302 at the center of the camera wafer 300. On a second (bottom) side, which faces the pedestal, the camera wafer 300 includes a wireless transmitter (e.g., Bluetooth device) as shown in FIG. 12 and electrical contacts 304 for charging the wireless transmitter and the camera 302. The fixture 200 is manufactured such that the OD of the annular platform 202 of the fixture 200 closely matches the OD 306 of the camera wafer 300.

Figure 4:
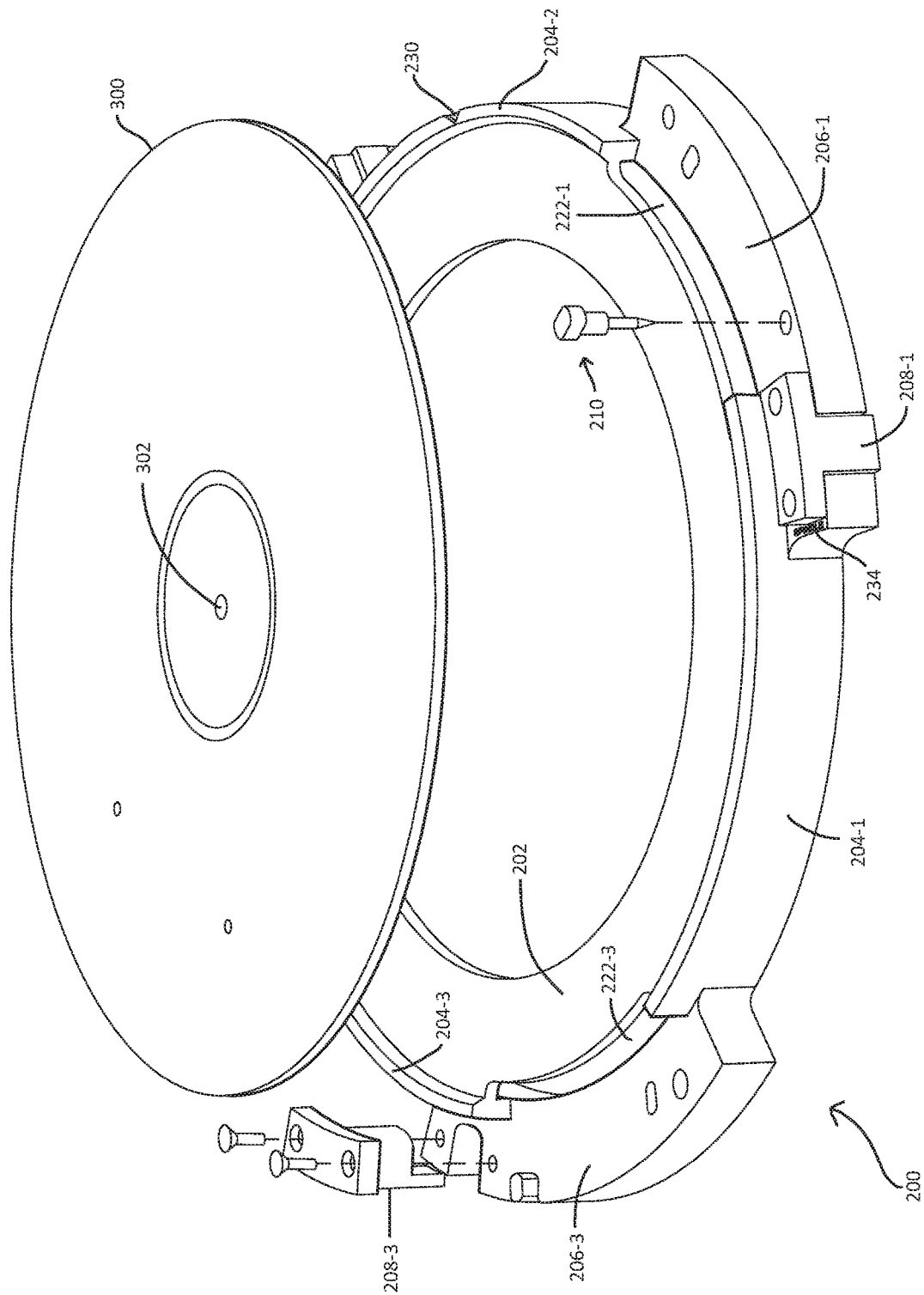
FIG. 4 shows the fixture with the wafer including the camera.

FIG. 4 shows the fixture 200 along with the camera wafer 300. As can be seen, the OD 306 of the camera wafer 300 closely matches the OD of the annular platform 202 of the fixture 200.

FIG. 5 shows a view from the bottom of the fixture 200. The view shows all three horizontal elements 206 and all three pins 210. Only one level indicator 220 is shown for brevity.

Figure 6:
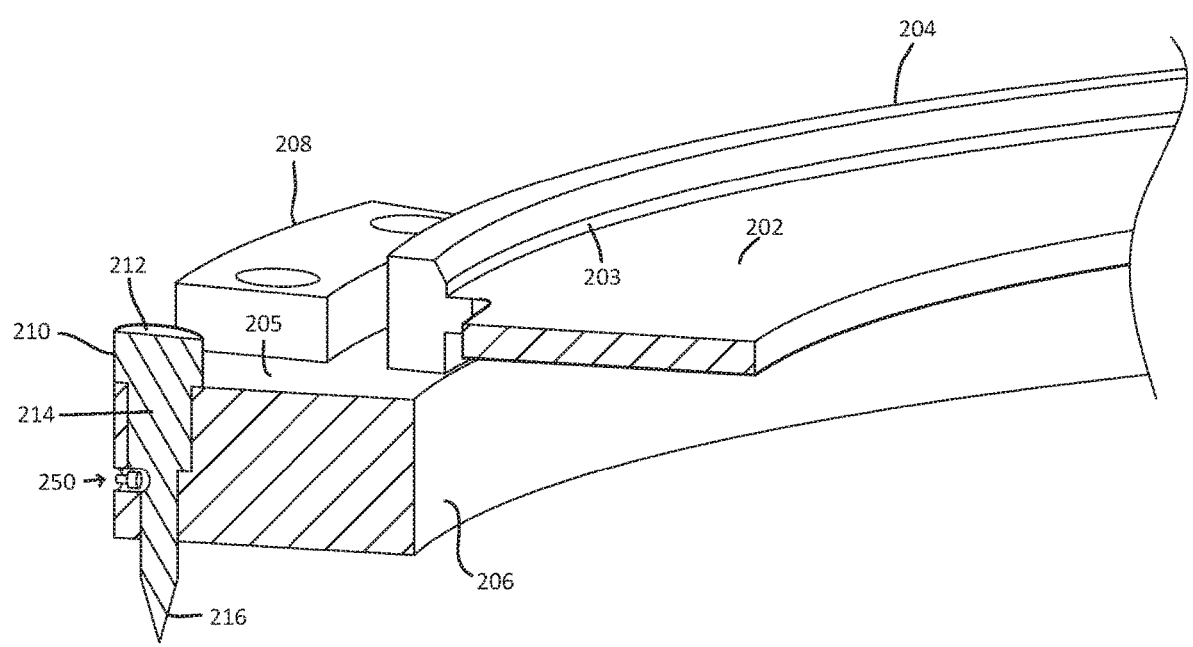
FIG. 6 shows elements of the fixture that are manufactured with tight tolerances.

FIG. 6 shows a portion of the fixture 200 to illustrate elements that are manufactured with tight tolerances. These elements include the annular platform 202 that defines the wafer plane and that is perfectly horizontal. The OD 203 of the annular platform 202 closely matches the OD 306 of the camera wafer 300 (for centering the camera wafer 300 to the center of the fixture 200). The top surface 205 of the horizontal element 206 defines the reference plane, is perfectly horizontal, and lies in a plane parallel to the plane of the annular platform 202 (i.e., the wafer plane). The top surfaces 205 of all the horizontal elements 206 are perfectly horizontal and lie in the same plane (i.e., the reference plane) that is parallel to the plane of the annular platform 202 (i.e., the wafer plane). A setscrew 250 is shown for example only and is not necessary. The fixture 200 operates as described with or without the setscrew 250.

The top surfaces of all the pins 210 are perfectly horizontal and lie in the same plane that is parallel to the plane of the annular platform 202. The threads 214 of the pin 210 that are small enough for fine adjustment during the alignment procedure. The conical portion 216 is designed to accommodate and adjust for pedestals with varying ODs. The pins 210 are nearly identical. Specifically, the length of the pins 210, the pitch of the threads 214, and the dimensions of the conical portions 216 are tightly controlled.

The dimensions of the all the elements of the fixture 200 are tightly controlled to provide precise alignment between the fixture 200 and the camera wafer, between the fixture 200 and the pedestal, and between the fixture 200, the pedestal, and the showerhead. The tightly controlled dimensions also ensure repeatability of the alignment procedure within the same chamber as well as across different chambers.

Figure 7:
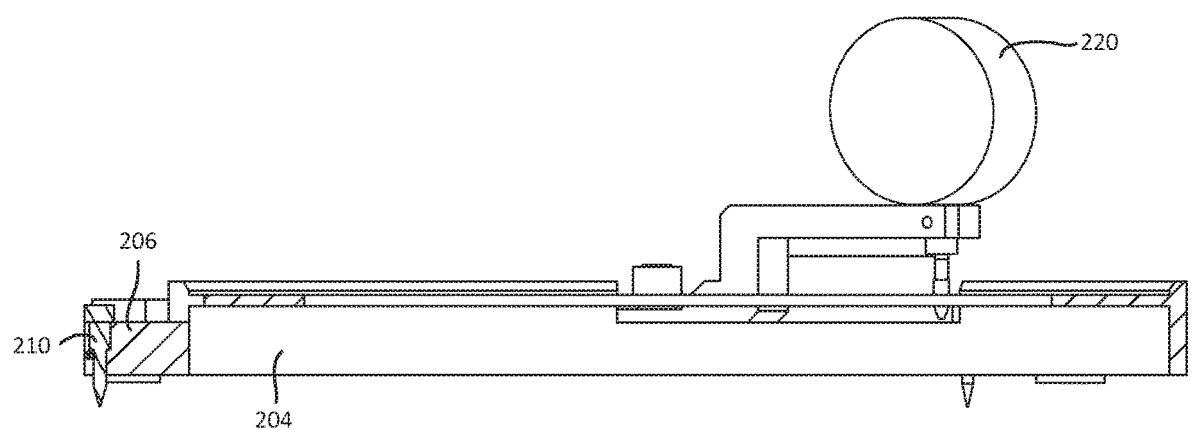
FIG. 7 shows an additional view of the fixture.
Figure 9:
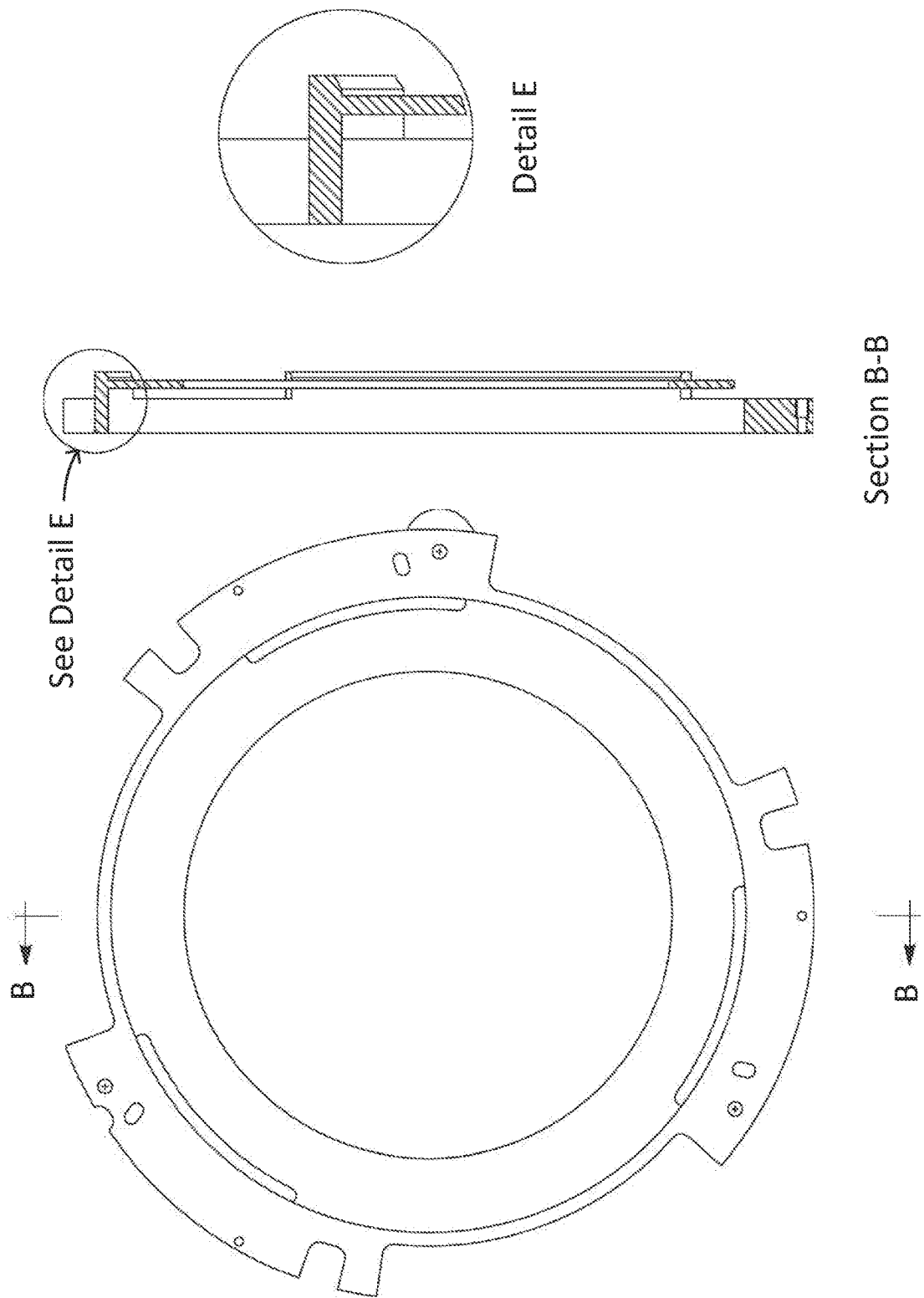

FIG. 7 shows an additional view of the fixture 200. FIGS. 8-11 show technical drawings of the fixture 200 showing the features of the fixture 200 in further detail. FIGS. 8 and 9 show additional views and details of the fixture 200. FIG. 10 shows additional views and details of the contact pads 208. FIG. 11 shows additional views and details of the pins 210.

In FIG. 10, the contact pad 208 is shown in further detail. The contact pad 208 includes a first portion 1000, a second portion 1002, and a third portion 1004. The first, second, and third portions 1000, 1002, and 1004 may also be called first, second, and third elements or members of the contact pads 208. The first, second, and third portions 1000, 1002, and 1004 are manufactured as a single piece and are inseparable from each other.

Although the contact pad 208 is arc-shaped, the contact pad 208 has a general shape of the letter "T". The first portion 1000 forms the top horizontal portion of the letter "T". The second and third portions 1002 and 1004 form the vertical portion of the letter "T". The arc length or width of the first portion 1000 is greater than the arc lengths or widths of the second and third portions 1002 and 1004, which gives the T-like shape to the contact pad 208. The third portion 1004 is shorter than the second portion 1002 forming a step-like structure as explained below.

The first portion 1000 is parallel to the planes in which the annular platform 202 and the horizontal element 206 lie (i.e., the wafer plane and the reference plane). The first portion 1000 includes one or more receptacles to receive fasteners to fasten the contact pad 208 to the respective horizontal element 206. The second and third portions 1002 and 1004 extend perpendicularly downward from the first portion 1000 in the direction away from the horizontal element 206 towards the pedestal. The second portion 1002 is longer than the third portion 1004. Accordingly, a step like structure is formed between the distal ends of the second and third portions 1002 and 1004. Specifically, the step like structure is formed by extending the distal end of the third portion 1004 towards approximately the center of the second portion 1002 from where the remainder of the second portion 1002 descends away from the distal end of the third portion 1004 (and the step portion) towards the pedestal.

The remainder of the second portion 1002 (i.e., from the step to the distal end of the second portion 1002) surrounds the OD of the pedestal, and the distal end of the third portion 1004 (i.e., the step portion) rests on the pedestal. The length (or height) of the third portion 1004 is slightly greater than the length (or height) of the horizontal elements 206. That is, the third portion 1004 extends slightly beyond the bottom of the horizontal elements 206 (and also the bottom of the vertical elements 204 since the bottoms of the horizontal and vertical elements 206 and 204 are in the same plane). In other words, the distal end of the third portion 1004 (i.e., the step portion) extends slightly beyond the bottom of the horizontal elements 206. Accordingly, the contact pads 208 raise the vertical and horizontal elements 204 and 206 above the top surface of the pedestal.

Thus, the contact pads 208 prevent contact between the top surface of the pedestal and the bottoms of the horizontal and vertical elements 206 and 204 and prevent scratching of the top surface of the pedestal. The only elements of the fixture 200 that contact the top surface of the pedestal are the distal ends of the third portions 1004 (i.e., the step portions) of the contact pads 208 and the conical portions 216 of the pins 210.

Further, the distance between the distal end of the second portion 1002 and the point where the distal end of the third portion 1004 meets the second portion 1002 (i.e., where the step is formed) is greater than a portion of the pins 210 (e.g., the conical portion 216) that protrudes below the horizontal element 206. Thus, the pointed ends of the conical portions 216 of the pins 210 are protected (prevented from being damaged) when the fixture 200 rests on the contact pads 208 (i.e., when the distal ends of the second portion 1002 of the contact pads 208 rest) on any surface, particularly when the fixture 200 is not in use and is stored.

FIG. 12 schematically shows a system 1200 comprising the fixture 200 and a computing device 1202 to align a pedestal 1204 to a showerhead 1206 in a processing chamber 1208. The fixture 200 uses the camera wafer 300 that includes the camera 302 to align the pedestal 1204 to the showerhead 1206 as explained below. The camera wafer 300 includes a wireless transmitter (e.g., Bluetooth device) 1210 that communicates with the camera 302 and with the computing device 1202.

The computing device 1202 is external to the processing chamber 1208 and includes a wireless transmitter (e.g., Bluetooth device). For example, the computing device 1202 may include a laptop computer, a tablet, or a smartphone. The computing device 1202 includes a database of images of various showerheads such as the showerhead 1206 that are captured from the centers of pedestals such as the pedestal 1204. These images serve as reference images during the alignment process.

The computing device 1202 executes an application that receives images of the showerhead 1206 captured by the camera 302. The computing device 1202 compares the images to the reference images of the showerhead in the database and guides the alignment process as explained below. The system 1200 comprises a pedestal movement mechanism 1212 (e.g., one or more actuators) that can be used to move the pedestal 1204 during the alignment process as explained below.

In use, the camera wafer 300 is placed on the annular platform 202 of the fixture 200. Due to the tight tolerances observed during manufacturing of the fixture 200, the ODs of the camera wafer 300 and the annular platform 202 match almost exactly. Accordingly, the centers of the camera wafer 300 and the annular platform 202, which is also the center of the fixture 200, are automatically aligned.

Next, the fixture 200 with the camera wafer 300 is placed on the pedestal 1204. The bottom portions of the contact pads 208 (specifically, the bottom portions of the elements 1004 or the step portions) rest on the top surface of the pedestal 1204. When the fixture 200 is manufactured, the contact pads 208 are fastened to the respective horizontal elements 206, and then the bottom portions of the contact pads 208 (specifically, the bottom portions of the elements 1004 or the step portions) are machined so that the bottom portions of the elements 1004 or the step portions lie on the same plane. The machining ensures that the horizontal elements 206 lie in the same horizontal plane (the reference plane) that is parallel to a plane passing through the bottom portions of the contact pads 208 (specifically, through the bottom portions of the elements 1004 or through the step portions).

Thus, the top surface of the pedestal 1204, which is presumed to be horizontal (achieved using some other mechanisms), is parallel to the plane in which the horizontal elements 206 lie (i.e., the reference plane) and to the plane in which the camera wafer 300 lies (i.e., the wafer plane). In other words, the contact pads 208 ensure that the fixture 200, the camera wafer 300, and the top surface of the pedestal 1204 are parallel to each other when the fixture 200 containing the camera wafer 300 is placed on the top surface of the pedestal 1204.

The next task is to align the center of the fixture 200 (i.e., the center of the camera wafer 300) to the center of the pedestal 1204. To align the center of the fixture 200 to the center of the pedestal 1204, the pins 210 are adjusted as follows. The pins 210 are adjusted to make the fixture 200, the camera wafer 300, and the top surface of the pedestal 1204 concentric as follows. As explained above with reference to FIG. 2, the locations of the pins 210 on the horizontal elements 206 of the fixture 200 lie on a circle that is concentric with the center of the fixture 200 (and the center of the camera wafer 300). The conical portions 216 of the pins 210 are used to align the fixture 200 to pedestals with varying ODs as follows. The amount of variation in the ODs that the pins 210 can adjust for is a function of the dimensions of the conical portion 216.

First, the level indicators 220 are installed on the respective horizontal elements 206 of the fixture 200 and are set to zero. Next, the level indicators 220 are moved to contact the top surfaces 212 of the respective pins 210. The heights of the pins 210 are adjusted by turning the top surfaces 212 of the pins 210 clockwise or counterclockwise until all the level indicators 220 read the same (i.e., show the same reading). At this point, the tips of the conical portions 216 of the pins define a circle that is concentric with the center of the fixture 200. That is, the center of the fixture 200 and the center of the camera wafer 300 are aligned with the center of the pedestal 1204. If an offset is desired between the center of the wafer and the center of the pedestal, the pins 210 are adjusted until the desired offset is achieved.

Next, the center of the pedestal 1204 is aligned to the center of the showerhead 1206 as follows. The processing chamber 1208 is closed. The pedestal 1204 is optionally moved to process position using the pedestal movement mechanism 1212. Vacuum is created in the processing chamber 1208. The camera 302 on the camera wafer 300 captures images of the showerhead 1206. The wireless transmitter 1210 transmits the captured images of the showerhead 1206 to the computing device 1202.

The computing device 1202 compares a captured image to a reference image of the showerhead 1206 stored in the database. Based on the comparison, the computing device 1202 determines whether the center of the showerhead 1206 in the captured image is aligned with the camera 302 and therefore with the center of the pedestal 1204. If not so aligned, the pedestal movement mechanism 1212 is used to move the pedestal 1204, and another image of the showerhead 1206 is captured and transmitted to the computing device 1202. This process is repeated until alignment is achieved (i.e., until the captured image matches the reference image). At this point, the center of the pedestal 1204 is aligned with the center of the showerhead 1206 (e.g., with a hole at the center of the showerhead 1206). Accordingly, the center of the pedestal 1204, the center of the camera wafer 300, and the center of the showerhead 1206 are aligned.

Thus, the fixture 200 and the camera wafer 300 are used to initially align the center of the fixture/wafer to the center of the pedestal and to subsequently align the center of the pedestal to the center of the showerhead. The fixture 200 provides repeatability within 0.005 inches. For example, when the fixture 200 is used and reused to align the pedestal to the showerhead in the same processing chamber and when the fixture 200 is rotated by say 180 degrees in a subsequent use instance relative to prior use instance, the results of alignment in the two instances differ by less than or equal to 0.005 inches. Similar repeatability is also achieved between processing chambers (i.e., when the fixture 200 is used in different processing chambers).

Figure 13:
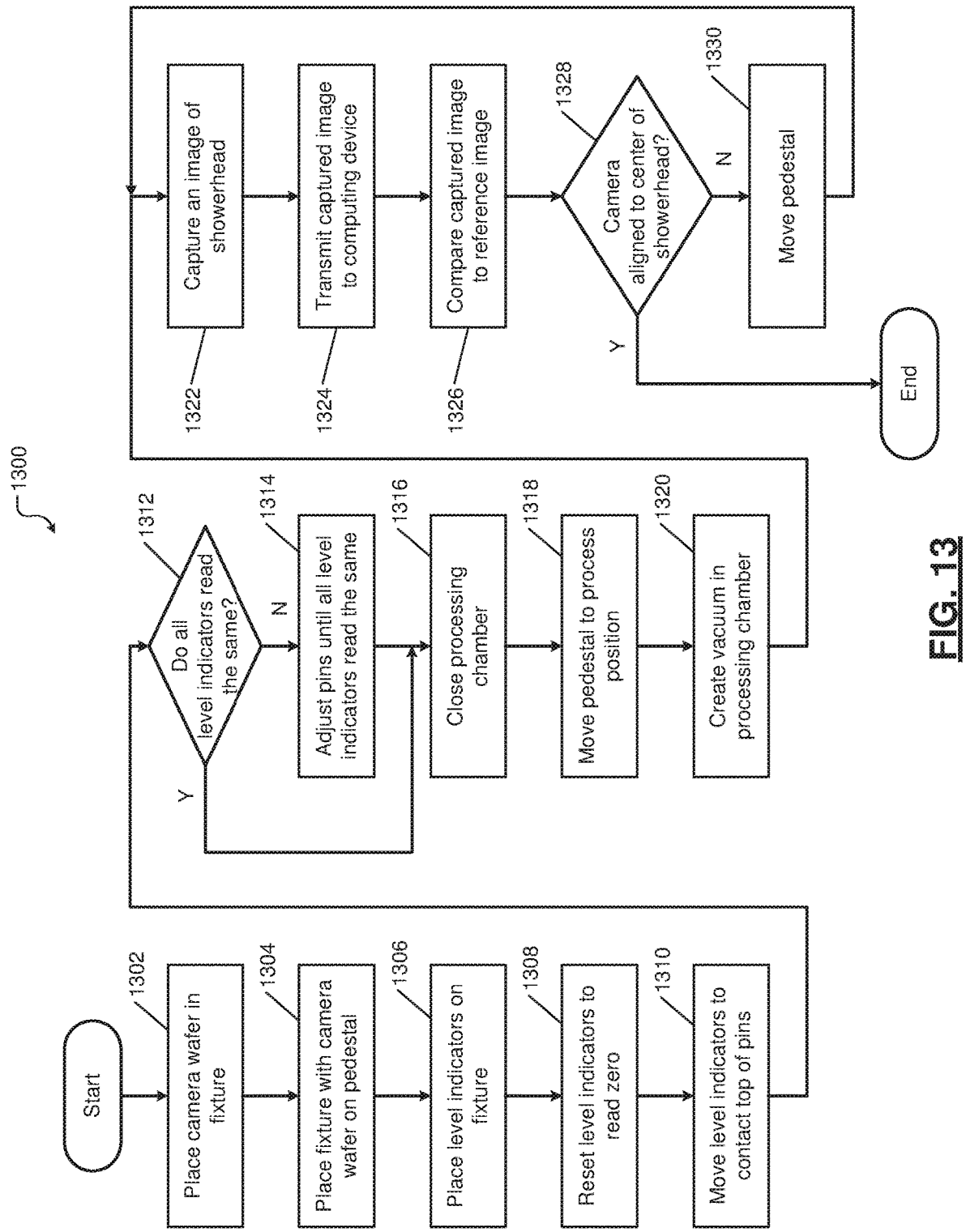
FIG. 13 shows a flowchart of a method for aligning the pedestal to the showerhead using the fixture.

FIG. 13 shows a method 1300 for aligning a pedestal to a showerhead in a processing chamber using the fixture 200. At 1302, a camera wafer is placed in the fixture. At 1304, the fixture with the camera wafer is placed on a pedestal. At 1306, level indicators are placed on the fixture. At 1308, the level indicators are reset to zero. At 1310, the level indicators are moved to contact top portions of pins on the fixture.

At 1312, the method 1300 determines whether all the level indicators show the same reading (i.e., whether the top surfaces of the pins are at the same level or in the same plane). At 1314, one or more pins are adjusted by turning the head portions clockwise or counterclockwise until all the level indicators read the same. At 1316, after all the level indicators read the same (i.e., after all the pins are at the same level), the center of the fixture and the center of the camera wafer is aligned to the center of the pedestal, and the processing chamber is closed. At 1318, the pedestal is optionally moved to process position. At 1320, vacuum is created in the processing chamber.

At 1322, the camera at the center of the camera wafer in the fixture captures an image of the showerhead. At 1324, a wireless transmitter in the camera wafer transmits the captured image to a computing device external to the processing chamber. At 1326, the computing device compares the captured image to a reference image. At 1328, the method 1300 determines whether the camera (i.e., the center of the pedestal) is aligned to the center of the showerhead. The method 1300 ends if the camera (i.e., the center of the pedestal) is aligned to the center of the showerhead. At 1330, if the camera (i.e., the center of the pedestal) is not aligned to the center of the showerhead, the pedestal is moved, and the method 1300 returns to 1322.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure.

Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate.

The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software).

The program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process.

In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control.

Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. An apparatus comprising:
    an annular member arranged along a first plane;
    N first members extending from an outer diameter of the annular member perpendicularly to the first plane, where N is an integer greater than two, wherein a first portion of each of the N first members extends above the first plane, and wherein a second portion of each of the N first members extends below the first plane; and
    N second members extending radially outward from the second portions of the N first members along a second plane that is parallel to the first plane, wherein each of the N second members lies between a different pair of the N first members.

2. The apparatus of claim 1 wherein the annular member, the N first members, and the N second members constitute a single structure.

3. The apparatus of claim 1 wherein the annular member, the N first members, and the N second members are made of a metal.

4. The apparatus of claim 1 further comprising N third members of equal lengths and made of a non-abrasive material respectively extending downward from the N second members perpendicularly to the second plane.

5. The apparatus of claim 4 further comprising:

N pins having equal lengths and conical ends and made of a non-abrasive material respectively extending downward from the N second members perpendicularly to the second plane, wherein the N pins are equidistant from a center of the annular member and include threads engageable with threaded slots in the N second members.

6. The apparatus of claim 1 further comprising:

N third members of equal lengths and made of a non-abrasive material arranged in respective slots in the N second members, wherein each of the N third members is arc-shaped and includes:
- a first element fastened to a respective one of the N second members parallel to the second plane;
- a second element extending perpendicularly from the first element below the second plane and below the respective one of the N second members; and
- a third element extending perpendicularly from the first element below the second plane and below the respective one of the N second members, and extending less than the second element.

7. The apparatus of claim 6 wherein the first, second, and third elements constitute a single structure.

8. The apparatus of claim 6 wherein the first element has a greater arc length than the second and third elements.

9. The apparatus of claim 6 wherein distal ends of the third elements of the N third members lie in a plane parallel to the second plane.

10. The apparatus of claim 6 further comprising:

N pins of equal lengths and made of the non-abrasive material extending downward perpendicularly to the second plane through respective threaded slots in the N second members at the same radial distance from a center of the annular member, wherein each of the N pins includes:
- a top portion;
- a conical bottom portion; and
- a threaded portion between the top and bottom portions engageable with a respective one of the threaded slots.

* * * * *